(12) United States Patent
Araya et al.

(10) Patent No.: US 7,366,647 B2
(45) Date of Patent: Apr. 29, 2008

(54) BUS PERFORMANCE EVALUATION METHOD FOR ALGORITHM DESCRIPTION

(75) Inventors: Yasuteru Araya, Kāwasaki (JP); Yuichi Maruyama, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 602 days.

(21) Appl. No.: 09/872,091

(22) Filed: Jun. 1, 2001

(65) Prior Publication Data
US 2002/0066082 A1 May 30, 2002

(30) Foreign Application Priority Data
Jun. 2, 2000 (JP) ............................ P2000-166630

(51) Int. Cl.
*G06F 17/50* (2006.01)

(52) U.S. Cl. ............................ 703/14; 703/14; 703/22; 716/1; 716/6; 716/5; 716/18; 714/30; 714/43

(58) Field of Classification Search ............... 716/5, 716/18, 6, 1; 703/13, 14, 21, 22; 714/30, 714/43; 702/16; 710/309; 711/149
See application file for complete search history.

(56) References Cited

U.S. PATENT DOCUMENTS

| | | | | |
|---|---|---|---|---|
| 5,604,895 | A * | 2/1997 | Raimi ........................... | 703/13 |
| 5,801,958 | A * | 9/1998 | Dangelo et al. ............... | 716/18 |
| 6,212,489 | B1 * | 4/2001 | Klein et al. .................... | 703/13 |
| 6,269,467 | B1 * | 7/2001 | Chang et al. ................... | 716/1 |
| 6,321,366 | B1 * | 11/2001 | Tseng et al. ..................... | 716/6 |
| 6,510,541 | B1 * | 1/2003 | Fujiwara et al. ................ | 716/5 |
| 6,546,505 | B1 * | 4/2003 | Swoboda et al. .............. | 714/30 |
| 6,694,488 | B1 * | 2/2004 | Raghunathan et al. ......... | 716/1 |

OTHER PUBLICATIONS

Brage et al., "A codesign case study in computer graphics", IEEE, 1994.*

(Continued)

*Primary Examiner*—K Thangavelu
(74) *Attorney, Agent, or Firm*—Scully, Scott, Murphy & Presser, P.C.

(57) ABSTRACT

The LSI design and development in manufacture is actualized by algorithm design, architecture design, actual hardware and software design, and verification. Herein, the architecture design contains a simulation program structuring process and a bus performance evaluation process, which are interconnected by a feedback loop. In the algorithm design, sources are described by the general-purpose high-level language such as the C language and C++ language. In the simulation program structuring process, the sources are subjected to isolation of the hardware and software, while an evaluation function is created to count bus traffic of the bus interconnecting the hardware and software. Every time data is written to a pre-defined variable loaded onto the bus, the evaluation function is performed to modify the sources. Then, evaluation is performed on the performance of the bus, so that the bus traffic for its processing rate is finally produced. That is, the result of the bus performance evaluation process is fed back to the simulation program structuring process such that isolation of the hardware and software is optimized in response to the bus traffic for the processing rate of the bus. This brings exclusion of feedback loops derived from the cooperative verification after the actual coding, so it is possible to considerably reduce overall turnaround time of design.

16 Claims, 11 Drawing Sheets

OTHER PUBLICATIONS

Vahid et al., "Toward a model for hardware and software functional partitioning", IEEE, 1996.*

Adams et al., "Execution time profiling for multiple process behavioral synthesis", IEEE, 1995.*

Lahiri et al., "Fast performance analysis of bus-based system-on-chip communication architectures", IEEE, 1999.*

Knudsen et al., " Integration communication protocol selection with hardware/software codesign", IEEE, 1999.*

Ernst, R. et al., "Hardware-Software Cosynthesis for Microcontrollers", IEEE Design & Test of Computers, IEEE, US, vol. 10, No. 4; pp. 64+65-75, Dec. 1, 1993.

Temam, O. et al., "Software Assistance for Data Caches", Future Generation Computer Systems, Elsevier Science Publishers, NI, vol. 11, No. 6, Oct. 1, 1995; pp. 519-536.

Herrman, D. et al., "An Approach to the Adaptation of Estimated Cost Parameters in the COSYMA System", Hardware/Software Codesign, 1994; Proceedings of the Third International Workshop on Grenoble, France, Sep. 22-24, 1994 , pp. 100-107.

Cosyma Architecture and Input Languages, "Online", Oct. 15, 1998 XP002230336.

European Examination Report dated Jul. 10, 2003.

Japanese Office Action dated Sep. 7, 2004.

Kale Tammermäe, et al. "AKKA: A tool-Kit for Cosynthesis and Prototyping", IEE Digest-Colloquim on Hardware-Software Cosynthesis for Reconfigurable Syhstems, vol. 96, No. 036, Feb. 1996 pop./ 8/a-8/8, XP0002244550.

o'Nils, M. et al. *Interactive Hardware-Software Partitioning and Memory Allocation Based on Data Transfer Profiling*, Int. Conf. Recent Adv. in Mechatronics. (1) Aug. 14, 1995, 447-452.

* cited by examiner

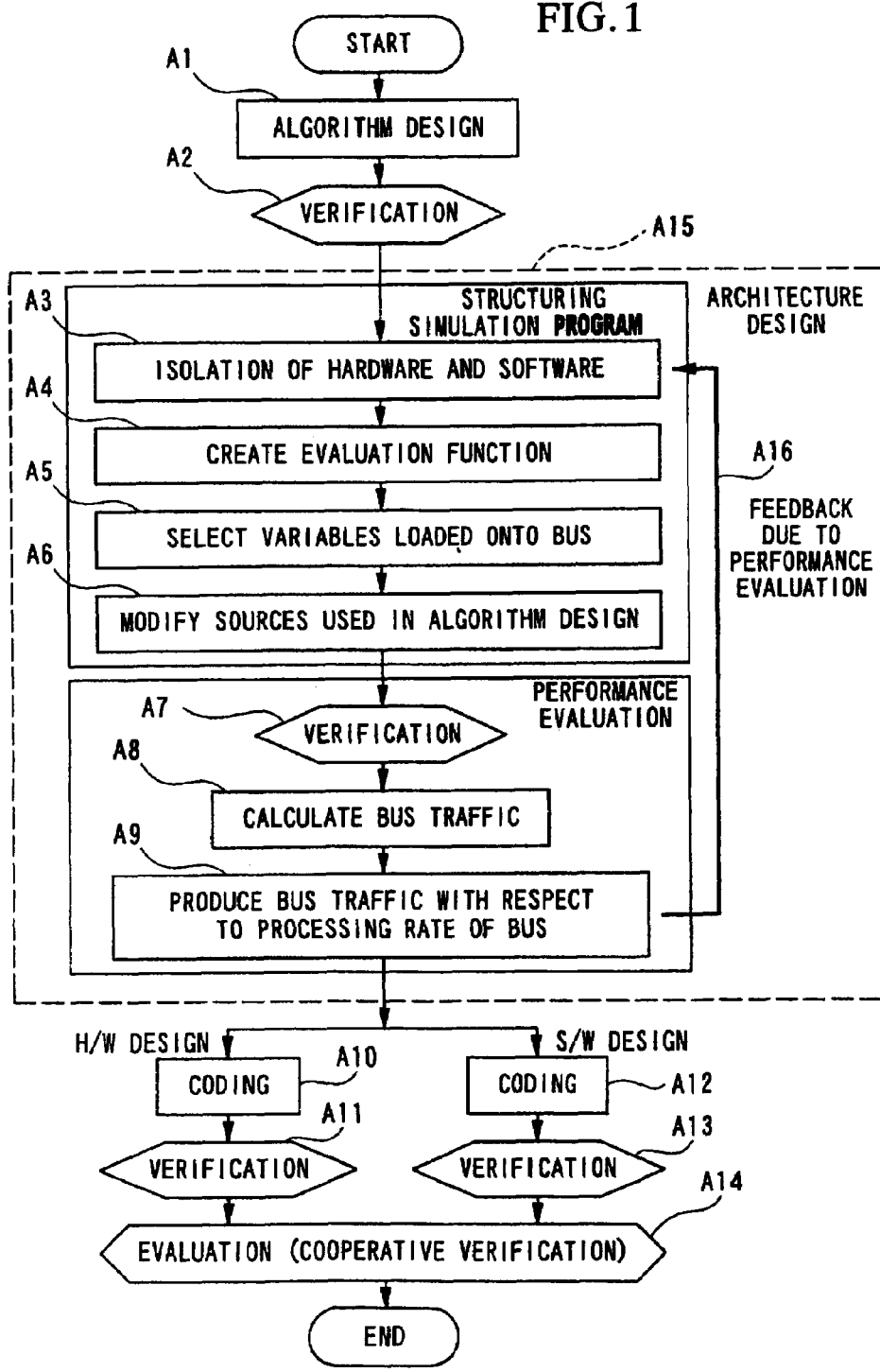

FIG.2

```
#include <stdio.h>
int BUS0(void);

int a;              /*VARIABLE LOADED ON EVALUATED BUS*/
int b;              /*VARIABLE LOADED ON EVALUATED BUS*/
int c;              /*VARIABLE LOADED ON EVALUATED BUS*/
/*MAIN FUNCTION*/
void main(void)
{
int bus0;
  :
  :
a=1;                /*EMBED EVALUATION FUNCTION SUBSEQUENT*/
bus0=BUS0();        /*TO VARIABLE TO WHICH DATA IS WRITTEN*/
  :
  :
b=1;
bus0=BUS0();
  :
  :
c=10;
bus0=BUS0();
  :
  :
a=3;
bus0=BUS0();
b=4;
bus0=BUS0();

printf("BUS Traffic=%d[回]\n",bus0);
{

/*EVALUATION FUNCTION*/
int BUS0(void)
{
static int i=0;
i++;                /*INCREMENT STATIC VARIABLE i */
return i;
}
```

FIG.3

```
#include <stdio.h>
int BUS0(void);

int a;              /*VARIABLE LOADED ON EVALUATED BUS*/
int b;
int c;              /*VARIABLE LOADED ON EVALUATED BUS*/
/*MAIN FUNCTION*/
void main(void)
{
int bus0;
  .
  .
a=1;                /*EMBED EVALUATION FUNCTION SUBSEQUENT*/
bus0=BUS0();        /*TO VARIABLE TO WHICH DATA IS WRITTEN*/
  .
                    /*EVALUATION FUNCTION IS  NOT*/
b=1;                /*EMBEDDED  SUBSEQUENT  TO*/
                    /*VARIABLE  b THAT IS NOT LOADED ON BUS*/
  .
  .
c=10;
bus0=BUS0();
  .
  .
a=3;
bus0=BUS0();
b=4;                /*EVALUATION FUNCTION IS  NOT*/
                    /*EMBEDDED  SUBSEQUENT  TO*/
                    /*VARIABLE  b THAT IS NOT LOADED ON BUS*/ printf("BUS Traffic=%d[回]\n",bus0);
{

/*EVALUATION FUNCTION*/
int BUS0(void)
{
static int i=0;
i++;                /*INCREMENT STATIC VARIABLE i */
return i;
}
```

FIG.5

```
#include <stdio.h>
int BUS0(void);

/*MAIN FUNCTION*/
void main(void)
{
int a;              /*VARIABLE LOADED ON EVALUATED BUS*/
int b;              /*VARIABLE LOADED ON EVALUATED BUS*/
int c;              /*VARIABLE LOADED ON EVALUATED BUS*/ int bus0;
 :
 :
a=0;                /*EMBED EVALUATION FUNCTION SUBSEQUENT*/
bus0=BUS0();        /*TO VARIABLE TO WHICH DATA IS WRITTEN*/
 :
 :
b=1;
bus0=BUS0();
 :
 :
c=10;
bus0=BUS0();
 :
 :
a=3;
bus0=BUS0();
b=4;
bus0=BUS0();

printf("BUS Traffic=%d[回]¥n",bus0);
{

/*EVALUATION FUNCTION*/
int BUS0(void)
{
static int i=0;
i++;                /*INCREMENT STATIC VARIABLE i*/
return i;
}
```

FIG. 6

```
#include <stdio.h>
int BUS0(void);

int a;              /*VARIABLE LOADED ON EVALUATED BUS*/
int b;              /*VARIABLE LOADED ON EVALUATED BUS*/
int c;              /*VARIABLE LOADED ON EVALUATED BUS*/

/*MAIN FUNCTION*/
void main(void)
{
int bus0;           /*EMBED EVALUATION FUNCTION JUST BEFORE*/
                    /*VARIABLE TO WHICH DATA IS WRITTEN*/
    :
bus0=BUS0();
a=0;
    :
bus0=BUS0();
b=1;
    :
bus0=BUS0();
c=10;
    :
bus0=BUS0();
a=3;
bus0=BUS0();
b=4;
printf("BUS Traffic=%d[回]\n",bus0);
{

/*EVALUATION FUNCTION*/
int BUS0(void)
{
static int i=0;
i++;                /*INCREMENT STATIC VARIABLE i*/
return i;
}
```

FIG. 7

```
#include <stdio.h>
int BUS1(int,int);

int a;          /*VARIABLE (32 BITS) LOADED ON EVALUATED BUS*/
int b;          /*VARIABLE (16 BITS) LOADED ON EVALUATED BUS*/

/*MAIN FUNCTION*/
void main(void)
{
int bus1;
   :
   :
a=7                    /*EMBED EVALUATION FUNCTION SUBSEQUENT*/
bus1=BUS1(32,8);       /*TO VARIABLE TO WHICH DATA IS WRITTEN*/
   :
   :
bus1=BUS1(32,8);
a=6;
bus1=BUS1(16,8);
b=10;
printf("BUS Traffic=%d[回]\n",bus1);
{

/*EVALUATION FUNCTION*/
int BUS1(int bit,int bus)      /*FUNCTION FOR INCREMENT*/
{                              /*BY DATA TRANSFER OF BUS*/
static int i=0;
i+=bit/bus;
return i;
}
```

FIG.8

```
#include <stdio.h>
int BUS2(int);

int a[10];      /*VARIABLE (ARRAY) LOADED ON EVALUATED BUS*/
int b[20];      /*VARIABLE (ARRAY) LOADED ON EVALUATED BUS*/
/*MAIN FUNCTION*/
void main(void)
{
int bus2;
int *adr;
  :
  :
adr=&a[0]       /*EMBED EVALUATION FUNCTION SUBSEQUENT TO*/
bus2=BUS2(10);  /*VARIABLE ON WHICH DATA TRANSFER OCCURS*/
  :
  :
adr=&a[0];
bus2=BUS2(10)
adr=&b[0];
bus2=BUS2(20);
printf("BUS Traffic=%d[回]\n",bus2);
{

/*EVALUATION FUNCTION*/
int BUS2(int ele)    /*FUNCTION FOR INCREMENT BY ARGUMENT*/
{
static int i=0;
i+=ele
return i;
}
```

FIG.9

```
#include <stdio.h>
void BUS3(void);

int a;              /*VARIABLE LOADED ON EVALUATED BUS*/
int b;              /*VARIABLE LOADED ON EVALUATED BUS*/ int bus=0;

/*MAIN FUNCTION*/   /*VARIABLE INCREMENTED BY*/
void main(void)     /*EVALUATION FUNCTION*/
{
    :
    :
a=0;                /*EMBED EVALUATION FUNCTION SUBSEQUENT*/
BUS3();             /*TO VARIABLE TO WHICH DATA IS WRITTEN*/
    :
    :
a=1;
BUS3();
b=10;
BUS3();
printf("BUS Traffic=%d[回]¥n",bus);
{

/*EVALUATION FUNCTION*/
int BUS3(vois)
{
bus++;              /*INCREMENT GLOBAL VARIABLE bus*/
}
```

FIG. 10

```
#include <stdio.h>
/*BUS CLASS*/
classBUS
{
int i;
public
BUS():i(0){ }
int count() {return i++}              /*FUNCTION FOR INCREMENTING i*/
int count_bit(int bit,int bus)        /*FUNCTION FOR INCREMENT BY*/
{                                     /*DATA TRANSFER OF BUS*/
i+=bit/bus;
return i;
}
int count_hairetu(int,ele)            /*FUNCTION FOR INCREMENT BY ARGUMENT*/
{
i+=ele
return i;
}
void print () {printf("BUS Traffic=%d[ ]¥n",i);}
} ;
int a;                                /*VARIABLE LOADED ON bus0*/
/*MAIN FUNCTION*/
int main()
{
BUS bus0;                             /*EVALUATED BUS (32 BITS)*/
BUS bus1;                             /*EVALUATED BUS (8 BITS)*/
BUS bus2;                             /*EVALUATED BUS (32 BITS)*/
int b;                                /*VARIABLE (32 BITS) LOADED ON bus1*/
int c[10];                            /*VARIABLE (ARRAY) LOADED ON bus2*/
int*cp;
int i;
a=0;                                  /*EMBED EVALUATION FUNCTION SUBSEQUENT*/
bus0.count();                         /*TO VARIABLE TO WHICH DATA IS WRITTEN*/
b=1;
bus1.count_bit(32,8)
cp=&c[0];
bus2.count_hairetu(10);
for(i=0;i<10;i++) {
bus0.count();                         /*EMBED EVALUATION FUNCTION JUST BEFORE*/
a=i;                                  /*VARIABLE TO WHICH DATA IS WRITTEN*/
bus1.count_bit(32,8);
b=i+1;
bus2.count()
c[i]=i*2;
}
bus0.print();
bus1.print();
bus2.print();
return0;
}
```

BUS PERFORMANCE EVALUATION METHOD FOR ALGORITHM DESCRIPTION

BACKGROUND OF THE INVENTION

1. Field of the Invention

This invention is provided for verification of algorithms in order to facilitate architecture designs at high-level stages of design. Specifically, this invention relates to bus performance evaluation methods for algorithm descriptions in which evaluation is performed on performances of buses interconnecting between the hardware and software by use of sources described by general purpose high-level languages such as the C language and C++ language.

2. Description of the Related Art

Due to the recent developments of the semiconductor technologies, there are tendencies for the physical hardware system to be frequently actualized by a single LSI chip rather than by plural LSI chips arranged on boards. For this reason, signals of the LSI chips that are conventionally interconnected with external terminals are translated to internal signals and are incorporated within the LSI chips in these days. To verify the conventional systems using the boards, it is necessary to produce LSI devices specifically for use in evaluation that is performed as if all internal signals are interconnected with external terminals. However, it is troublesome for manufacturers to perform verification on the systems by using the specifically designed LSI devices. Actually, the recent developments raise a difficulty in which verification is difficult to perform using the foregoing boards.

FIG. 11 shows a flow of steps showing the conventional procedures for the design and development of LSI (hereinafter, simply referred to as LSI design and development) in manufacture of logic circuits, systems and devices. Prior to the actual manufacturing, simulation programs (or algorithms) are normally structured without consideration of distinctions between the hardware and software (see step B1). In step B2, verification is made as to whether the algorithms are correctly made or not. Next, isolation of the hardware and software is performed on the structured simulation program, which are divided into hardware elements and software elements of the simulation program respectively. The isolation of the hardware and software is made by experimentation.

In the hardware design (or H/W design), elements having equivalent functions of the algorithms are generally described by equivalent HDL source code(which stands for 'Hardware Description Language'), then, composition of circuitry is carried out (see step B3). In step B4, verification is made as to whether the sources operate correctly or not. In the software design (or S/W design), elements having equivalent functions of the algorithms are generally described by equivalent source code of a programming language having a CPU dependency (see step B5). In step B6, verification is made as to whether the sources operate correctly or not. Lastly, cooperative verification is performed on combinations of the hardware and software (see step B7).

Prior to the actual manufacturing of LSI, the procedures for the LSI design and development should meet some essential conditions regarding requirements of the system simulation and bus performance evaluation as well as the architecture design in which isolation of the hardware and software is performed by simulation. Conventionally, the system simulation is performed by the cooperative verification on the unification of the hardware and software.

Due to rapid increases in scales of integrated circuits being manufactured in these days, it becomes necessary to provide considerably large numbers of lines of codes to describe the circuits to be created. This causes considerable reduction in simulation speed of the cooperative verification on descriptions using the HDL or other programming languages each having a CPU dependency. In practice, it becomes very difficult to perform the architecture design using the cooperative verification.

In the architecture design using the cooperative verification, there may occur necessities of modifications on buses interconnecting said elements to be implemented in the hardware and/or in software due to results of evaluation of performances of the buses. In that case, it is necessary to modify the HDL or other programming languages each having a CPU dependency (see steps B8, B9 in FIG. 11).

Due to increasing numbers of lines of codes to describe the circuits to be created, circuit descriptions must become more and more complicated, which in turn cause complexity in modifications of the circuit descriptions. That is, it takes much time and cost to perform operations regarding feedback loops being derived from results of the cooperative verification. Recently, there are tendencies in which periods for developments of LSI are considerably reduced while the circuit scales are increased more and more. To cope with such tendencies, the procedures of the LSI design and development should meet some essential conditions in which evaluation of performances of the buses interconnecting elements to be implemented in hardware and/or in software and the architecture design are performed at high-level stages of design respectively.

SUMMARY OF THE INVENTION

It is an object of the invention to provide a bus performance evaluation method for algorithm description by which it is possible to considerably reduce turnaround times in design of LSI by excluding unwanted operations between hardware and software through feedback loops derived from cooperative verification in the hardware design and software design. According to an aspect of the invention, these provide a method as defined in independent claim 11. Basically, this invention provides improvements in procedures for the design and development of LSI. That is, after isolation of the hardware and software being effected with respect to hardware and software sources described by the general purpose high-level language in algorithm design, an evaluation function is created to count traffic of the bus interconnecting elements to be implemented in hardware and/or in software. The sources are modified such that the evaluation function is performed every time data (e.g., a variable) is loaded onto the bus. Then, evaluation is performed on the performance of the bus having a processing rate. Based on the bus traffic that is finally produced with respect to the processing rate, isolation of the hardware and software is optimally performed at a simulation stage of the architecture design. Thus, it is possible to exclude the conventional feedback loops regarding the isolation between the hardware and software from the cooperative final verification after the actual coding. As a result, it is possible to considerably reduce the turnaround time in the design of LSI.

More specifically, the LSI design and development in manufacture is actualized by algorithm design, architecture design, actual hardware and software design, and verification. Herein, the architecture design contains a simulation platform structuring process and a bus performance evaluation process, which are interconnected by a feedback loop. In the algorithm design, sources are described by the general purpose high-level language such as the C language and C++ language. In the simulation platform structunng process, the sources are subjected to isolation of the hardware and software, while an evaluation function is created to count bus traffic of the bus interconnecting the hardware and software. Every time data is written to a pre-defined variable loaded onto the bus, the evaluation function is performed to modify the sources. Then, evaluation is performed on the performance of the bus, so that the bus traffic for its processing rate is finally produced. That is, result of the bus performance evaluation process is fed back to the simulation platform structuring process such that isolation of the hardware and software is optimized in response to the bus traffic for the processing rate of the bus. This results in more efficient isolation between hardware and software elements so that hardware and software cooperative verification may be performed without constantly designating hardware and software elements, so it is possible to considerably reduce overall turnaround time of design.

BRIEF DESCRIPTION OF THE DRAWINGS

These and other objects, aspects and embodiments of the present invention will be described in more detail with reference to the following drawing figures, of which:

FIG. 1 is a flowchart showing procedures for design and development of LSI in accordance with the invention;

FIG. 2 shows a list form representing a bus performance evaluation method in accordance with a first embodiment of the invention;

FIG. 3 shows a list form representing a simulation platform that is restructured in accordance with the first embodiment shown in FIG. 2;

FIG. 5 shows a list form representing a bus performance evaluation method in accordance with a second embodiment of the invention;

FIG. 6 shows a list form representing a bus performance evaluation method in accordance with a third embodiment of the invention;

FIG. 7 shows a list form representing a bus performance evaluation method in accordance with a fourth embodiment of the invention;

FIG. 8 shows a list form representing a bus performance evaluation method in accordance with a fifth embodiment of the invention;

FIG. 9 shows a list form representing a bus performance evaluation method in accordance with a sixth embodiment of the invention;

FIG. 10 shows a list form representing a simulation platform that is structured using sources described by the C++ language.

DESCRIPTION OF THE PREFERRED EMBODIMENTS

This invention will be described in further detail by way of examples with reference to the accompanying drawings.

Figure 11:
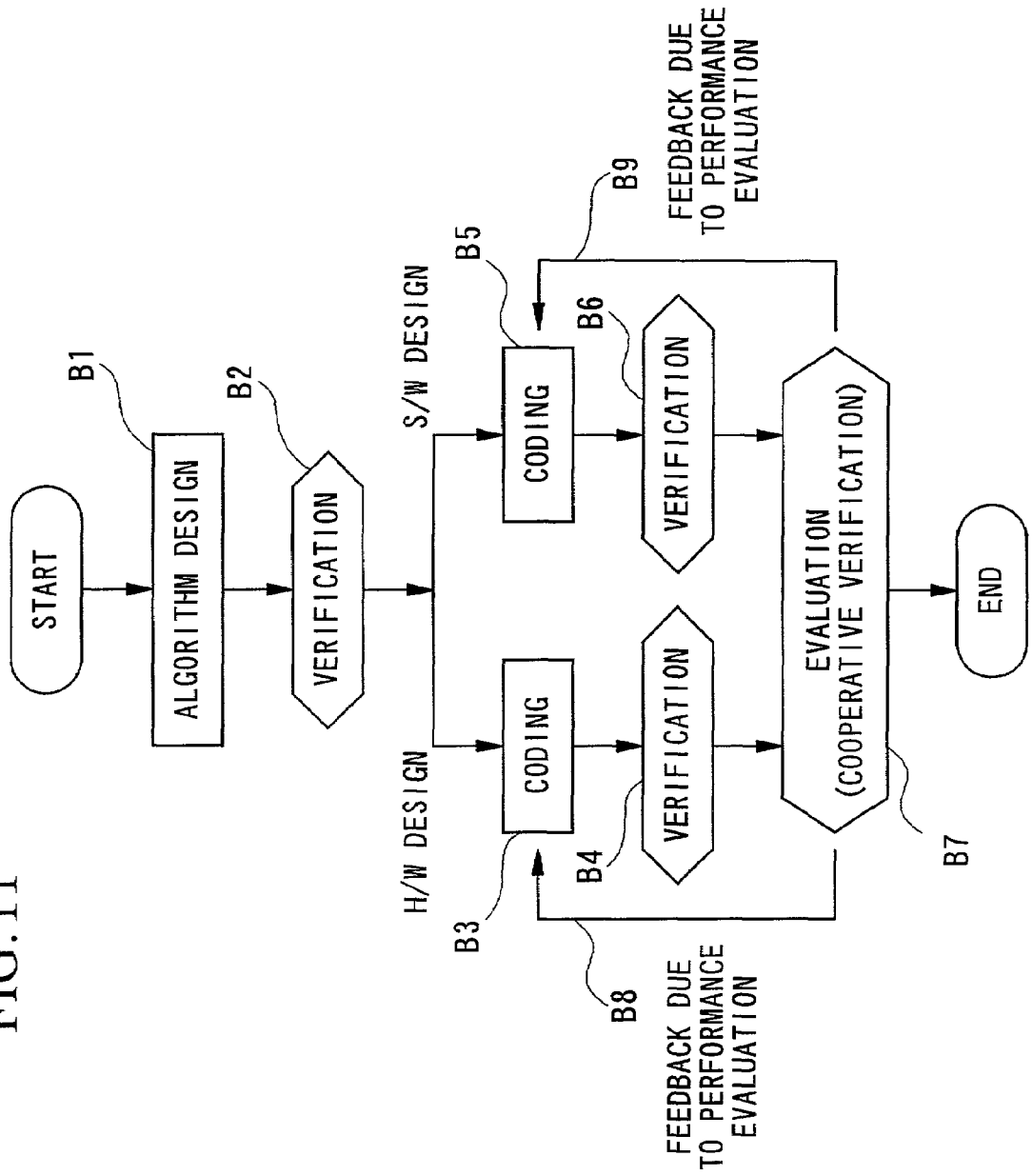
FIG. 11 is a flowchart showing procedures for the conventional design and development of LSI.

FIG. 1 shows a flow of procedures for design and development of LSI in accordance with the invention. As compared with the conventional flow of procedures for the LSI design and development that is described in conjunction with FIG. 11, the present flow shown in FIG. 1 provides the architecture design at the high-level stage of design and is characterized by adding a simulation program structuring process and a bus performance evaluation process (see step A15). Details of these processes will be described below.

In step A1, algorithms are designed to be implemented in logic circuits, devices and systems to be manufactured. In step A2, verification is made as to whether the algorithms are made correctly or not.

Next a simulation program is structured to perform architecture design by using sources, which are used in the aforementioned algorithm design. Namely, in the simulation program structuring process, the flow proceeds to step A3 to effect isolation of the hardware and software. In step A4, an evaluation function is created. Herein, it is satisfactory that the evaluation function has an operation of counting a certain value for the bus traffic.

In step A5, variables loaded onto the bus interconnecting the hardware and software are being selected. Then, the flow proceeds to step A6 in which sources that are used in the algorithm design are modified depending on the results of the created evaluation function when data are written to the variables loaded onto the bus, in other words, when data transfer is effected on the bus that is a subject of evaluation (hereinafter, simply referred to as the 'evaluated' bus). In response to modifications of the sources, the simulation program for use in the architecture design is structured again.

Next, evaluation is performed on the performance of the bus, which is a subject of evaluation, by using the structured simulation program. That is, in the performance evaluation process, the flow proceeds to step A7 in which verification is performed using the structured simulation program. In step A8, bus traffic is calculated by the prescribed method, which depends on the created evaluation function. Herein, a processing rate requested by a main function is provided from the high-level design stage. Hence, the bus traffic is calculated with respect to the processing rate of the evaluated bus in step A9.

It is possible to check validity with respect to isolation of the hardware and software and a bus configuration. If the validity check causes a change of the bus, the sources that are described by the general purpose high-level language such as the C language and C++ language are modified, then, the simulation program is structured again and the performance evaluation is performed again. That is, the present procedures provide a feedback ioop (see step A16) for feeding back the result of the performance evaluation of the bus. Due to provision of such a feedback loop, it is possible to actualize the architecture design at the high-level stage of design.

After completion of the architecture design in step A15, the flow proceeds to the hardware design (HIW design) and the software design (S/W design) respectively. In the hardware design, sources having equivalent functions of the algorithm(s) are generally described by the HDL (i.e., Hardware Description Language), then, composition of circuitry is performed in step A10. In step A11, verification is made as to whether the sources operate normally or not. In the software design, sources having equivalent functions of the algorithm(s) are generally described by the programming language having a CPU dependency in step A12. In step A13, verification is made as to whether the sources operate normally or not.

In step A14, cooperative operational verification is performed on the unified hardware and software. In the present flow of procedures for the design and development of LSI, the architecture design is already completed at the high-level stage of design. This places the cooperative verification as one type of simulation for making operational confirmation only, in which no design is newly made. Namely, this eliminates the necessity to provide feedback loops being derived from the cooperative verification.

FIG. 2 shows a list form representing a bus performance evaluation method in accordance with the first embodiment of the invention. With reference to FIG. 2, there are provided three variables, namely 'a', 'b' and 'c' being loaded onto the evaluated bus, wherein all of the variables are subjected to global definition. In addition, there are provided an evaluation function 'BUS0( )' and a local variable 'Bus0( )'. Herein, the evaluation function increments a static variable i to provide a return value. The local variable bus0 stores the return value from the evaluation function BUS0( ). Namely, it represents a number of times in effecting data transfer on the evaluated bus. The same number of bits are set to binary representations of the three variables a, b, c being loaded onto the evaluated bus. Herein, the number of bits of each variable is smaller than the number of bit lines (or bits) of the evaluated bus.

The first embodiment shown in FIG. 2 is designed to certainly execute the evaluation function BUS0( ) when data are written to the variables a, b, c loaded onto the evaluated bus. So, the evaluation function BUS0( ) is embedded subsequent to (or just after) the variables to which data are written respectively. Every time the evaluation function BUS0( ) is executed, the static variable i is incremented to provide a return value. The return value from the evaluation function BUS0( ) represents the number of times in writing data to the variables loaded onto the evaluated bus.

In addition, the number of times in writing the data to the variables loaded onto the evaluated bus represents a number of times in effecting data transfer on the evaluated bus, namely bus traffic. Because the processing rate requested by the main function is already known, it is possible to calculate the bus traffic for the processing rate and effect performance evaluation in accordance with the following equation (1).

(Bus traffic for the processing rate)=(number of times in effecting data transfer)/(processing rate)    (1)

To change the bus interconnecting the hardware and software in response to the bus traffic being calculated for the processing rate, the sources used in the algorithm design are modified so that the simulation program is to be structured again.

FIG. 3 shows an example of the 'restructured' simulation program. With reference to the restructured simulation program shown in FIG. 3, the variable b is regarded as one that is not to be loaded onto the evaluated bus because of result of the performance evaluation of the bus. That is, the restructured simulation program has only two variables a, b that are being loaded onto the evaluated bus. Since the variable b is not loaded onto the bus, the evaluation function BUS0( ) is not embedded subsequent to the variable b to which data is written. In contrast, the evaluation function BUS0( ) is certainly embedded subsequent to the variables a, c to which data are written respectively. Thus, the evaluation function BUS0( ) is certainly executed just after the variables a, c to which the data are written respectively.

After restructuring of the simulation program, verification is performed by simulation. Then, the bus traffic for the processing rate is calculated again in accordance with the equation (1), so that evaluation is performed on the performance of the bus.

Through the aforementioned operations, an average bus traffic is produced with respect to the data rate of the evaluated bus. Then, performance evaluation is performed on the bus, so that the result of the performance evaluation is fed back to structuring of the simulation program. Hence, it is possible to actualize the architecture design at the high-level stage of design.

Figure 4:
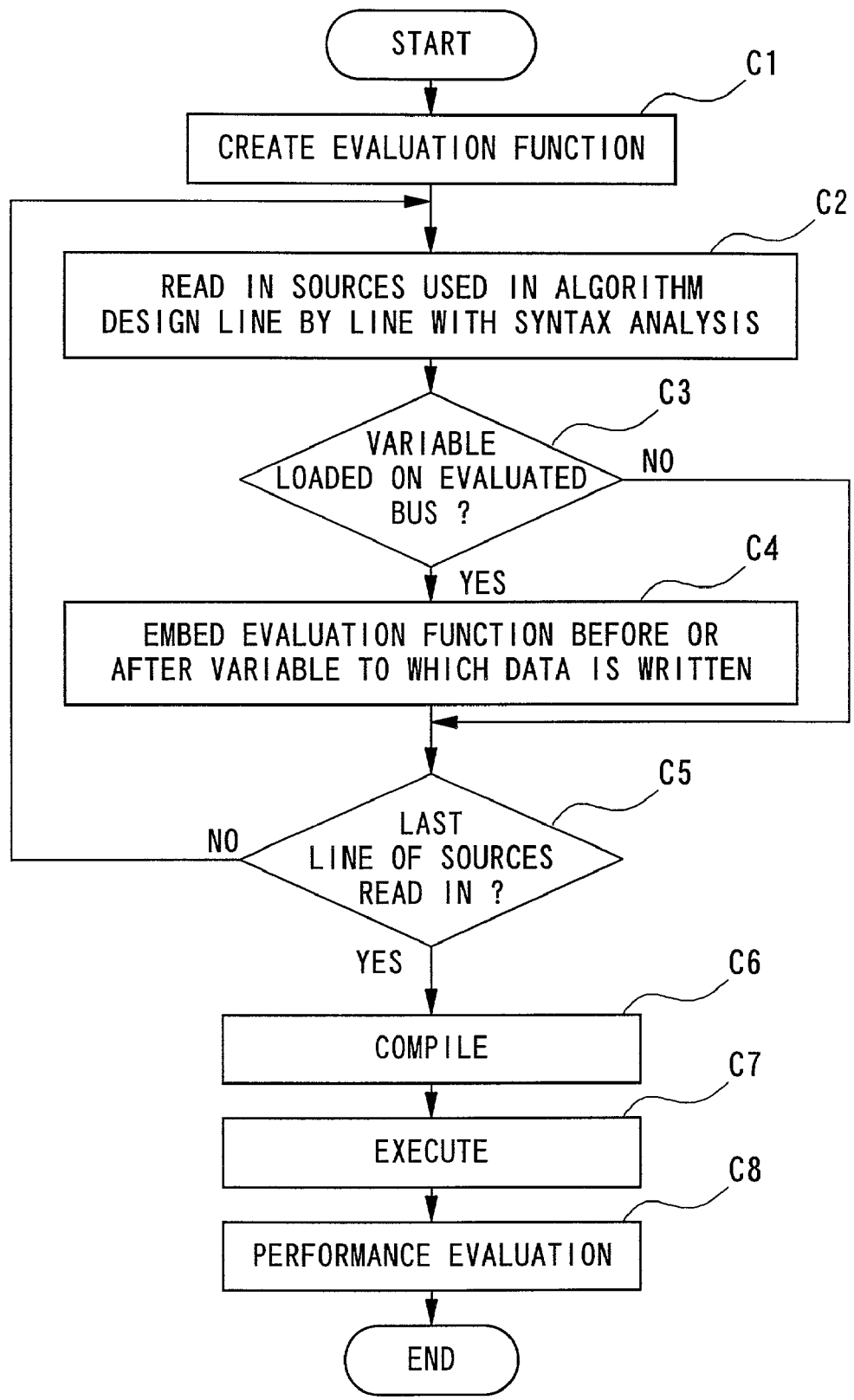
FIG. 4 is a flowchart showing a procedure that is effected by the first embodiment shown in FIG. 2.

FIG. 4 shows a flow of steps that are performed by a computer system realizing the aforementioned bus performance evaluation method shown in FIG. 1.

With reference to FIG. 4, the flow firstly proceeds to step C1 in which a specific evaluation function is created. It is satisfactory that the evaluation function meets an operation of incrementing a certain value for the bus traffic. Herein, the algorithm design uses sources that are described by the C language or C++ language. In step C2, the system reads the sources line by line while effecting syntax analysis.

In step C3, a decision is made as to whether the read sources describe operations of writing data to the variables loaded onto the evaluated bus or not. If so, the flow proceeds to step C4 in which the evaluation function is embedded subsequent to the variables to which the data are written respectively. Due to the aforementioned works, the evaluation function is certainly executed when the data are written to the variables loaded onto the evaluated bus, in other words, when data transfer is caused on the evaluated bus.

In step C5, a decision is made as to whether description of the sources reading in the aforementioned works is completed up to the last line of the sources originally used in the algorithm design or not. Thus, modification is effected on the sources originally used in the algorithm design. After the modification proceeds to the last line of the sources used in the algorithm design, the flow proceeds to step C6 in which the system compiles the modified sources to structure the simulation program for use in the architecture design. In step C7, bus traffic is calculated for the evaluated bus by execution of the simulation program. Because the processing rate requested by the main function is already known, the bus traffic for the processing rate is produced so that performance evaluation is performed on the evaluated bus in step C8.

FIGS. 5 to 10 show examples of list forms representing the bus performance evaluation methods in accordance with other embodiments of the invention. Next, those embodiments will be described in detail in comparison with the aforementioned first embodiment shown in FIG. 2.

FIG. 5 shows the bus performance evaluation method of the second embodiment that has three variables a, b and c, which are loaded on the evaluated bus and all of which are locally defined. In addition, there are provided an evaluation function BUS0( ) and a local variable Bus0( ). The evaluation function increments a static variable i to provide a return value. The local variable Bus0( ) stores the return value from the evaluation function BUS0( ). That is, it represents a number of times in effecting data transfer on the evaluated bus.

All of the variables a, b and c consist of the same number of bits, which is smaller than a number of lines (or bits) of the evaluated bus. A main difference between the first embodiment of FIG. 2 and the second embodiment of FIG. 5 lies in manners of definition of the variables, that is, the variables loaded onto the evaluated bus are not defined globally but defined locally in FIG. 5. To perform performance evaluation on the bus, bus traffic for its processing rate is calculated in accordance with the aforementioned equation (1).

As the second embodiment is designed such that the variables loaded onto the evaluated bus are not defined globally but are defined locally, it proceeds to calculation of the bus traffic for the processing rate and performance evaluation of the bus, then, it feeds back the result of the performance evaluation to structuring of the simulation platform. Therefore, as similar to the first embodiment, the second embodiment allows the architecture design to be effected at the high-level stage of design.

FIG. 6 shows the bus performance evaluation method of the third embodiment that has three variables a, b and c, which are loaded onto the evaluated bus and all of which are defined globally. In addition, there are provided an evaluation function BUS0( ) and a local variable bus0( ). Herein, the evaluation function increments a static variable i to provide a return value. The local variable bus0( ) stores the return value from the evaluation function BUS0( ). That is, it represents a number of times in effecting data transfer on the evaluated bus.

All of the variables a, b and c consist of the same number of bits, which is smaller than a number of lines (or bits) of the evaluated bus. A main difference between the first embodiment of FIG. 2 and the third embodiment of FIG. 6 lies in manners of embedding of the evaluation function BUS0( ), that is, the evaluation function is embedded just before the variables to which data are written respectively. Thus, the evaluation function is certainly performed when the data are written to the variables respectively, in other words, when data transfer is effected on the evaluated bus. Incidentally, the third embodiment performs the performance evaluation upon calculation of the bus traffic for the processing rate by the aforementioned equation (1).

As described above, the third embodiment is designed such that the evaluation function BUS0( ) is embedded just before the variables to which data are written respectively, in other words, it is designed such that the evaluation function BUS0( ) is to be certainly performed when data are written to the variables respectively or when data transfer is effected on the evaluated bus. Herein, the third embodiment proceeds to calculation of the bus traffic for the processing rate and performance evaluation of the bus, then, it feeds back the result of the performance evaluation to structuring of the simulation platform. Therefore, as similar to the first embodiment, the third embodiment allows the architecture design to be effected at the high-level stage of design.

Next, a description will be given with respect to the case where all of the variables a, b and c have the same number of bits, which is greater than the number of lines (or bits) of the evaluated bus. The description will be given with respect to the case where each of the variables a, b and c consists of n bits while the evaluated bus consists of m bits (where n≧m). For example, n is set to '32', and 'm' is set to '8'.

In the aforementioned case, when data are written to the variables loaded onto the evaluated bus, data transfer is effected on the bus multiple times, a number of which is calculated by 'n/m', that is, four times. To perform the performance evaluation on the bus, bus traffic for its processing rate is calculated by the following equation (2).

(Bus traffic for the processing rate)=(number of times in execution)×(n/m)/(processing rate)  (2)

Next, further embodiments of the invention will be described with reference to FIGS. 7 to 10

FIG. 7 shows the bus performance evaluation method of the fourth embodiment that has two variables a, b loaded onto the evaluated bus, wherein both of the variables are defined globally. In addition, there are provided an evaluation function BUS1( ) and a local variable bus1. Herein, the evaluation function BUS1( ) has two arguments, namely 'bit' and 'bus'. That is, it increments a static variable i by 'bit/bus' to provide a return value. The local variable bus1 stores the return value from the evaluation function BUS1( ). That is, it represents a number of times in effecting data transfer on the evaluated bus.

Suppose that the variable a loaded onto the evaluated bus consists of thirty-two bits while the variable b loaded onto the evaluated bus consists of sixteen bits, wherein the evaluated bus consists of eight bits.

Different from the foregoing first embodiment of FIG. 2, the fourth embodiment of FIG. 7 deals with two variables loaded onto the evaluated bus, wherein the two variables are configured by different numbers of bits, both of which are greater than the number of bits of the evaluated bus. In addition, the fourth embodiment of FIG. 7 is characterized by that the evaluation function having two arguments 'bit' and 'bus', and it increments the static variable i to provide a return value. To perform performance evaluation on the bus, bus traffic for its processing rate is calculated by the aforementioned equation (1).

Although the fourth embodiment is designed such that the variables loaded onto the evaluated bus are configured by different numbers of bits, which are greater than the number of bits of the evaluated bus, it proceeds to calculation of the bus traffic for the processing rate and performance evaluation of the bus, then, it feeds back the result of the performance evaluation to structuring of the simulation platform. Therefore, as similar to the first embodiment, the fourth embodiment allows the architecture design to be effected at the high-level stage of design.

FIG. 8 shows the bus performance evaluation method of the fifth embodiment that has two variables a, b loaded onto the evaluated bus, which are defined by specific arrays respectively. In addition, there are provided an evaluation function BUS0( ) and a local variable bus2. Herein, the evaluation function has an argument 'ele', so it increments a static variable i by 'ele' to provide a return value. The local variable bus2 stores the return value from the evaluation function BUS2( ), so it represents a number of times in effecting data transfer on the evaluated bus.

Both of the variables a, b loaded onto the evaluated bus consist of the same number of bits, which is smaller than the number of bits of the evaluated bus. Different from the first embodiment of FIG. 2, the fifth embodiment of FIG. 8 is designed such that both of the variables loaded onto the evaluated bus are defined by specific arrays, and address transfer is effected in the main function. In addition, the fifth embodiment is characterized by that the evaluation function having an argument 'ele' increments the static variable i by 'ele' to provide a return value.

To perform performance evaluation on the bus, bus traffic for its processing rate is calculated by the aforementioned equation (1).

Although the fifth embodiment is designed such that the variables loaded onto the evaluated bus are defined by the specific arrays, and the address transfer is effected in the main function, the fifth embodiment proceeds to calculation of the bus traffic for the processing rate and performance evaluation of the bus, then, it feeds back the result of the performance evaluation to structuring of the simulation program. Therefore, as similar to the first embodiment, the fifth embodiment allows the architecture design to be effected at the high-level stage of design.

FIG. 9 shows the bus performance evaluation method of the sixth embodiment that has two variables a, b loaded onto the evaluated bus, wherein the variables are both defined globally. In addition, there are provided an evaluation function BUS3( ) and a global variable 'bus'. The evaluation function increments the global variable 'bus'. The global variable 'bus' represents a number of times in effecting data transfer on the evaluated bus.

Both of the variables a, b consist of the same number of bits, which is smaller than a number of bits of the evaluated bus. Different from the first embodiment of FIG. 1, the sixth embodiment of FIG. 9 is characterized by that the variables to be incremented by the evaluation function are defined globally.

To perform performance evaluation on the bus, bus traffic for its processing rate is calculated by the foregoing equation (1).

Although the sixth embodiment is designed such that the variables to be incremented by the evaluation function are defined globally, the sixth embodiment proceeds to calculation of the bus traffic for the processing rate and performance evaluation of the bus, then, it feeds back the result of the performance evaluation to structuring of the simulation platform. Therefore, as similar to the first embodiment, the sixth embodiment allows the architecture design to be effected at the high-level stage of design.

FIG. 10 shows an example of a simulation program that is structured by sources described by the C++ language.

In the simulation platform shown in FIG. 10, there are provided three buses, namely 'bus0', 'bus1' and 'bus2' which are subjected to BUS class definition as well as three variables a, b and c. Herein, the variable a is defined globally and is loaded onto the bus bus0. The variable b is defined locally and is loaded onto the bus bus1. The variable c is defined by a specific array and is loaded onto the bus bus2.

There is provided a BUS class, which has a function 'count( )' for incrementing a member variable i by '1' as well as two arguments, namely 'bit' and 'bus'. In addition, there are provided a function 'Count_bit( )' for incrementing the member variable i by 'bit/bus' and an argument 'ele'. Further, a function 'count_hairetu( )' for incrementing the member variable i by 'ele' is defined. Therefore, the member variable i within the BUS class represents a number of times in effecting data transfer on the evaluated bus.

Both of the variables a, c loaded onto the evaluated bus consists of the same number of bits, which is smaller than numbers of bits of the buses bus0 and bus1 respectively. In addition, the variable b loaded onto the evaluated bus consists of thirty-two bits, while the bus bus1 consists of eight bits.

Different from the foregoing embodiments (including the first embodiment of FIG. 2), the simulation program of FIG. 10 is characterized by the sources being described by the C++ language. To perform performance evaluation on the bus, bus traffic for its processing rate is calculated by the aforementioned equation (1).

Although the simulation program is structured using the sources described by the C++ language as shown in FIG. 10, it proceeds to calculation of the bus traffic for the processing rate and performance evaluation of the bus, then, it feeds back the result of the performance evaluation to restructuring of the simulation program. Therefore, it is possible to carry out the architecture design at the high-level stage of design.

As described heretofore, this invention is designed such that when data transfer is caused on the bus interconnecting between the hardware and software to be evaluated, the sources that are used in the architecture design and are described by the general purpose high-level language such as the C language and C++ language are modified by executing the specific evaluation function, so that the simulation program for use in the architecture design is structured. Then, simulation is performed using the structured simulation program to calculate the bus traffic for the processing rate of the evaluated bus. Thus, it is possible to perform the bus performance evaluation at the high-level stage of design.

Result of the bus performance evaluation is fed back to the sources that are used in verification of the algorithm(s). This enables the architecture design to be performed at the high-level stage of design. So, it is possible to reduce overall simulation time that is necessary for the architecture design. In addition, this invention is characterized by placing the cooperative verification on the unification of the hardware and software as one type of simulation that merely performs operational confirmation. That is, it is possible to exclude actual designing steps from the cooperative verification, so it is possible to considerably reduce the time and cost that are needed for design and development of the logic circuits, systems and devices.

As described heretofore, this invention has a variety of effects and technical features, which will be described below.

(1) When data are written to variables loaded onto the evaluated bus, sources that are described by the general purpose high-level language such as the C language and C++ language for use in the algorithm design are modified by executing a specific evaluation function for increment by a certain value for bus traffic, so that a simulation program is structured. Hence, bus traffic is calculated in connection with the processing rate of the bus interconnecting between the hardware and software, so bus performance evaluation can be performed at the high-level stage of design in the LSI design and development. In addition, result of performance evaluation of the bus is fed back to structuring of the simulation program, so it is possible to perform the architecture design at the high-level stage of design. Because the architecture design is performed using the sources that are described by the general purpose high-level language for use in the algorithm design, it is possible to considerably reduce overall simulation time for the architecture design. Generally speaking, as compared with the HDL, the C language and C++ language are increased in simulation speed to be approximately one-thousand times higher.

(2) Because the architecture design is performed using the sources that are described by the general purpose high-level language, it is possible to simplify feedback procedures due to the architecture design. By optimally performing isolation of the hardware and software at the prescribed stage of the architecture design, it is possible to exclude feedback loops regarding the isolation of the hardware and software from the cooperative verification after the actual coding. This guarantees considerable reduction of the turnaround time of design. As compared with the HDL and assembly languages, the C and C++ language can be used relative small number of lines of code. That is, those languages can be easily changed and modified according to needs.

(3) This invention places the cooperative verification on unification of the hardware and software as one type of simulation for merely performing operational confirmation, wherein no design is newly performed. This brings exclusion of the feedback loops being derived from the cooperative verification. That is, it is possible to reduce a number of times in effecting simulation in RTL (Register Transfer Level), so it is possible to considerably reduce overall time and cost for the design of circuitry. Such an effect becomes substantial as the scale of circuitry being manufactured increases.

As this invention may be embodied in several forms without departing from the teaching of essential characteristics thereof the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A method in a LSI design and development process for creating and evaluating an architecture design for an algorithm design by performing a performance evaluation of at least one bus at a high-level stage of said design and development process, said method comprising:

structuring source code describing the algorithm design in a general purpose high-level programming language by isolating elements of said source code into elements representing hardware units and elements representing software units creating the architecture design of an LSI;

creating an evaluation function for counting data traffic that occurs on said at least one bus, the bus being a part of the source code realizing the data traffic between said elements representing hardware units and software units;

sequentially reading in the source code line by line while effecting syntax analysis;

determining whether the source code is to be modified based on whether a line of source code represents writing data to variables that are defined in advance and are loaded onto the bus to be evaluated;

modifying at least one element of said source code based on an implementation of said evaluation function; and performing said performance evaluation by simulating said modified source code elements and counting said data traffic on the bus, wherein said performance evaluation is used to modify the architecture design of the LSI.

2. The method according to claim 1, further comprising:
restructuring the source code based on the counted data traffic; and
performing said performance evaluation again by simulating said restructured source code again.

3. The method according to claim 1, wherein a bus traffic is calculated from the counted data traffic using a processing rate of the bus.

4. The method according to claim 1, further comprising:
feeding back a result of the performance evaluation of the bus to the step of structuring the source code to improve the architecture design at the high-level design stage by isolating elements of said source code into new elements representing hardware units and new elements representing software units.

5. The method according to claim 4, wherein in response to the bus traffic, isolation of the source code into the new elements representing hardware units and the new elements representing software units is optimized.

6. The method according to claim 1, further comprising:
upon determining that the source code is to be modified, modifying the source code by embedding the evaluation function one of immediately before or immediately after the line of source code in which the variables are written;

repeating the steps of sequentially reading in the source code, determining whether the source code is to be modified, and modifying at least one element of said source code elements until the source code is completely read in up to a last line of source code;

structuring the source code into elements representing the hardware units and elements representing the software units in the architecture design and compiling said source code;

organizing the compiled source code elements in a simulation program, executing the simulation program and calculating the data traffic on the bus;

calculating bus traffic using a known processing rate of the bus; and performing evaluation of the performance of the bus in response to the bus traffic.

7. The method according to claim 6, wherein the variables loaded onto the bus consist of n bits while the bus consists of m bit lines, where n and m are both integers, and n is a multiple of m, and the bus traffic for the processing rate is produced such that the data traffic on the bus is multiplied by n/m and is then divided by the processing rate of the bus.

8. The method according to claim 1, wherein the general purpose high-level programming language is one of C language and C++ language.

9. The method according to claim 1, wherein the evaluation function increments a counting value if a pre-defined variable is loaded onto the bus.

10. A method in a LSI design and development process for facilitating and evaluating an architecture design for an algorithm design by performing a performance evaluation of at least one bus at a high-level stage of said design and development process, said method comprises the steps of:

structuring a source code describing the algorithm design in a general purpose high-level programming language by isolating said source code into hardware elements and software elements interconnected by said bus having a bus configuration creating the architecture design of an LSI;

creating an evaluation function for counting data traffic that occurs on said bus, wherein said evaluation function counts and represents a number of times the source code effects said data traffic on said bus;

sequentially reading in said source code;

determining whether a line of source code represents writing data to variables that are defined in advance and are loaded onto the bus to be evaluated;

upon the determination, modifying the source code by embedding the evaluation function just before or after the line of source code in which one or more of the variables defined in advance are written;

repeating the steps of sequentially reading in the source code, determining whether the source code represents writing data to variables defined in advance, and modifying the source code by embedding the evaluation function until the source code is completely read in and modified up to a last line of source code;

compiling said structured source code elements;

organizing the compiled source code elements in a simulation program;

executing the simulation program and calculating the data traffic on the bus according to the evaluation function at the high level design stage;

calculating the bus traffic based on the data traffic and a known processing rate of the bus; and performing the performance evaluation of the bus in response to the bus traffic being produced;

wherein said method is carried out again in response to the performance evaluation if said bus performance is not acceptable by starting with restructuring the source code and changing said bus configuration, and wherein said performance evaluation is used to modify the architecture design of the LSI.

11. The method according to claim 10, further comprising:

feeding back the result of the performance evaluation of the bus to the step of structuring the source code to improve the architecture design at the high-level design stage by re-isolating said source code into hardware elements and software elements.

12. The method according to claim 10, wherein the bus configuration comprises the number of bit lines of the bus and, in response to the bus traffic, isolation of the source code into hardware elements and software elements is optimized by changing the number of bit lines of the bus.

13. The method according to claim 10, further comprising: after creating the evaluation function, sequentially reading in the source code line by line while effecting syntax analysis.

14. The method according to claim 1, wherein the variables loaded onto the bus consist of n bits while the bus consists of m bit lines, where n, m are both integral numbers, and n>=m, and the bus traffic for the processing rate is produced such that the data traffic on the bus is multiplied by n/m and is then divided by the processing rate of the bus.

15. The method according to claim 1, wherein the general purpose high-level programming language is C language or C++ language.

16. The method according to claim 1, wherein the evaluation function increments a counter value if a pre-defined variable is loaded onto the bus.

* * * * *